(12) United States Patent
Nakatani

(10) Patent No.: US 12,080,550 B2
(45) Date of Patent: Sep. 3, 2024

(54) METHOD OF MANUFACTURING SEMICONDUCTOR DEVICE, SUBSTRATE PROCESSING METHOD, SUBSTRATE PROCESSING APPARATUS, AND RECORDING MEDIUM

(71) Applicant: KOKUSAI ELECTRIC CORPORATION, Tokyo (JP)

(72) Inventor: Kimihiko Nakatani, Toyama (JP)

(73) Assignee: Kokusai Electric Corporation, Tokyo (JP)

(*) Notice: Subject to any disclaimer, the term of this patent is extended or adjusted under 35 U.S.C. 154(b) by 412 days.

(21) Appl. No.: 17/575,854

(22) Filed: Jan. 14, 2022

(65) Prior Publication Data
US 2022/0139696 A1    May 5, 2022

Related U.S. Application Data

(63) Continuation of application No. PCT/JP2019/027901, filed on Jul. 16, 2019.

(51) Int. Cl.
*H01L 21/00* (2006.01)
*C23C 16/34* (2006.01)
(Continued)

(52) U.S. Cl.
CPC ........ *H01L 21/0228* (2013.01); *C23C 16/345* (2013.01); *C23C 16/36* (2013.01);
(Continued)

(58) Field of Classification Search
CPC .... H01L 21/0228; C23C 16/345; C23C 16/36
See application file for complete search history.

(56) References Cited

U.S. PATENT DOCUMENTS 8,987,146 B2 * 3/2015 Kirikihira ......... H01L 21/02211
438/758
9,613,798 B2 * 4/2017 Yamamoto ............ C23C 16/345
(Continued)

FOREIGN PATENT DOCUMENTS

CN    114026678 A * 2/2022 ........... C23C 16/345
EP    4245883 A1 * 9/2023 ......... C23C 16/0272
(Continued)

OTHER PUBLICATIONS

International Search Report, PCT/JP2019/027901, Oct. 15, 2019 (5 pgs.).
(Continued)

*Primary Examiner* — Laura M Menz
(74) *Attorney, Agent, or Firm* — Volpe Koenig

(57) ABSTRACT

There is provided a technique that includes: forming a film so as to be embedded in a recess formed on a surface of a substrate by performing a cycle a predetermined number of times, the cycle including: (a) supplying a pseudo-catalyst to the substrate in a process chamber; (b) exhausting the pseudo-catalyst remaining in the process chamber; (c) supplying a precursor to the substrate in the process chamber; and (d) exhausting the precursor remaining in the process chamber, wherein in (a), the pseudo-catalyst is adsorbed on the surface of the substrate under a condition that chemical adsorption of the pseudo-catalyst on the surface of the substrate is unsaturated.

21 Claims, 15 Drawing Sheets

(51) Int. Cl.
    *C23C 16/36*         (2006.01)
    *C23C 16/455*      (2006.01)
    *C23C 16/52*         (2006.01)
    *H01L 21/02*        (2006.01)

(52) U.S. Cl.
    CPC ........ *C23C 16/45544* (2013.01); *C23C 16/52* (2013.01); *H01L 21/02312* (2013.01); *H01L 21/0217* (2013.01)

(56) References Cited

U.S. PATENT DOCUMENTS

| | | | |
|---|---|---|---|
| 11,183,382 B2 * | 11/2021 | Nakatani | .......... H01L 21/02337 |
| 11,527,402 B2 * | 12/2022 | Hashimoto | ....... H01L 21/02219 |
| 11,746,416 B2 * | 9/2023 | Nakatani | .......... C23C 16/45553 |
| | | | 438/786 |
| 11,923,193 B2 * | 3/2024 | Nakatani | .......... H01L 21/30604 |
| 2013/0052836 A1 * | 2/2013 | Hirose | .............. H01L 21/02337 |
| | | | 118/704 |
| 2014/0227886 A1 * | 8/2014 | Sano | ................. C23C 16/45531 |
| | | | 438/762 |
| 2015/0311060 A1 * | 10/2015 | Sano | ....................... C23C 16/56 |
| | | | 118/704 |
| 2016/0233085 A1 * | 8/2016 | Yamaguchi | .............. C23C 16/30 |
| 2018/0363138 A1 * | 12/2018 | Nakatani | .......... H01L 21/02211 |
| 2019/0189432 A1 * | 6/2019 | Nakatani | ................. C23C 16/36 |
| 2020/0176249 A1 * | 6/2020 | Nakatani | ............. H01L 21/0228 |
| 2021/0005448 A1 * | 1/2021 | Nakatani | ................. C23C 16/56 |
| 2021/0066073 A1 * | 3/2021 | Hashimoto | ....... H01L 21/02208 |
| 2021/0249303 A1 * | 8/2021 | Blanquart | ............. C23C 16/045 |
| 2022/0139696 A1 * | 5/2022 | Nakatani | ............... C23C 16/401 |
| | | | 438/761 |
| 2023/0067218 A1 * | 3/2023 | Hashimoto | ....... C23C 16/45534 |
| 2023/0357926 A1 * | 11/2023 | Nakatani | ................. C23C 16/56 |

FOREIGN PATENT DOCUMENTS

| | | | | |
|---|---|---|---|---|
| EP | 4340003 A1 * | 3/2024 | ......... C23C 16/4408 |
| JP | 2004-023043 A | 1/2004 | |
| JP | 2014-154809 A | 8/2014 | |
| JP | 2016-034042 A | 3/2016 | |
| JP | 2019-110263 A | 7/2019 | |
| JP | 7149423 B2 * | 10/2022 | ........... C23C 16/345 |
| KR | 1020120092672 A | 8/2012 | |
| KR | 1020190074980 A | 6/2019 | |
| WO | 2011/125395 A1 | 10/2011 | |
| WO | 2015/045099 A1 | 4/2015 | |
| WO | WO-2021009838 A1 * | 1/2021 | ........... C23C 16/345 |

OTHER PUBLICATIONS

Office Action for Japanese Patent Application No. 2021-532593, issued on Jun. 28, 2022. 2 pages.

Korean Office Action issued on Mar. 28, 2024 for Korean Patent Application No. 10-2022-7001114.

* cited by examiner

○ Physical adsorption component of $BCl_3$
● Chemical adsorption component of $BCl_3$ SiN

METHOD OF MANUFACTURING SEMICONDUCTOR DEVICE, SUBSTRATE PROCESSING METHOD, SUBSTRATE PROCESSING APPARATUS, AND RECORDING MEDIUM

CROSS-REFERENCE TO RELATED APPLICATION

This application is a Bypass Continuation Application of PCT International Application No. PCT/JP2019/027901, filed on Jul. 16, 2019, the entire contents of which are incorporated herein by reference.

TECHNICAL FIELD

The present disclosure relates to a method of manufacturing a semiconductor device, a substrate processing method, a substrate processing apparatus, and a recording medium.

BACKGROUND

In the related art, as a process of manufacturing a semiconductor device, a substrate processing process of forming a film so as to be embedded in a recess formed on the surface of a substrate may be often carried out.

SUMMARY

Some embodiments of the present disclosure provide a technique capable of improving the characteristic of embedding a film in a recess formed on the surface of a substrate.

According to one or more embodiments of the present disclosure, there is provided a technique that includes: forming a film so as to be embedded in a recess formed on a surface of a substrate by performing a cycle a predetermined number of times, the cycle including: (a) supplying a pseudo-catalyst to the substrate in a process chamber; (b) exhausting the pseudo-catalyst remaining in the process chamber; (c) supplying a precursor to the substrate in the process chamber; and (d) exhausting the precursor remaining in the process chamber, wherein in (a), the pseudo-catalyst is adsorbed on the surface of the substrate under a condition that chemical adsorption of the pseudo-catalyst on the surface of the substrate is unsaturated.

BRIEF DESCRIPTION OF DRAWINGS

The accompanying drawings, which are incorporated in and constitute a part of the specification, illustrate embodiments of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

One Embodiment of the Present Disclosure

One embodiment of the present disclosure will be now described mainly with reference to FIGS. 1 to 4.

(1) Configuration of Substrate Processing Apparatus

Figure 1:
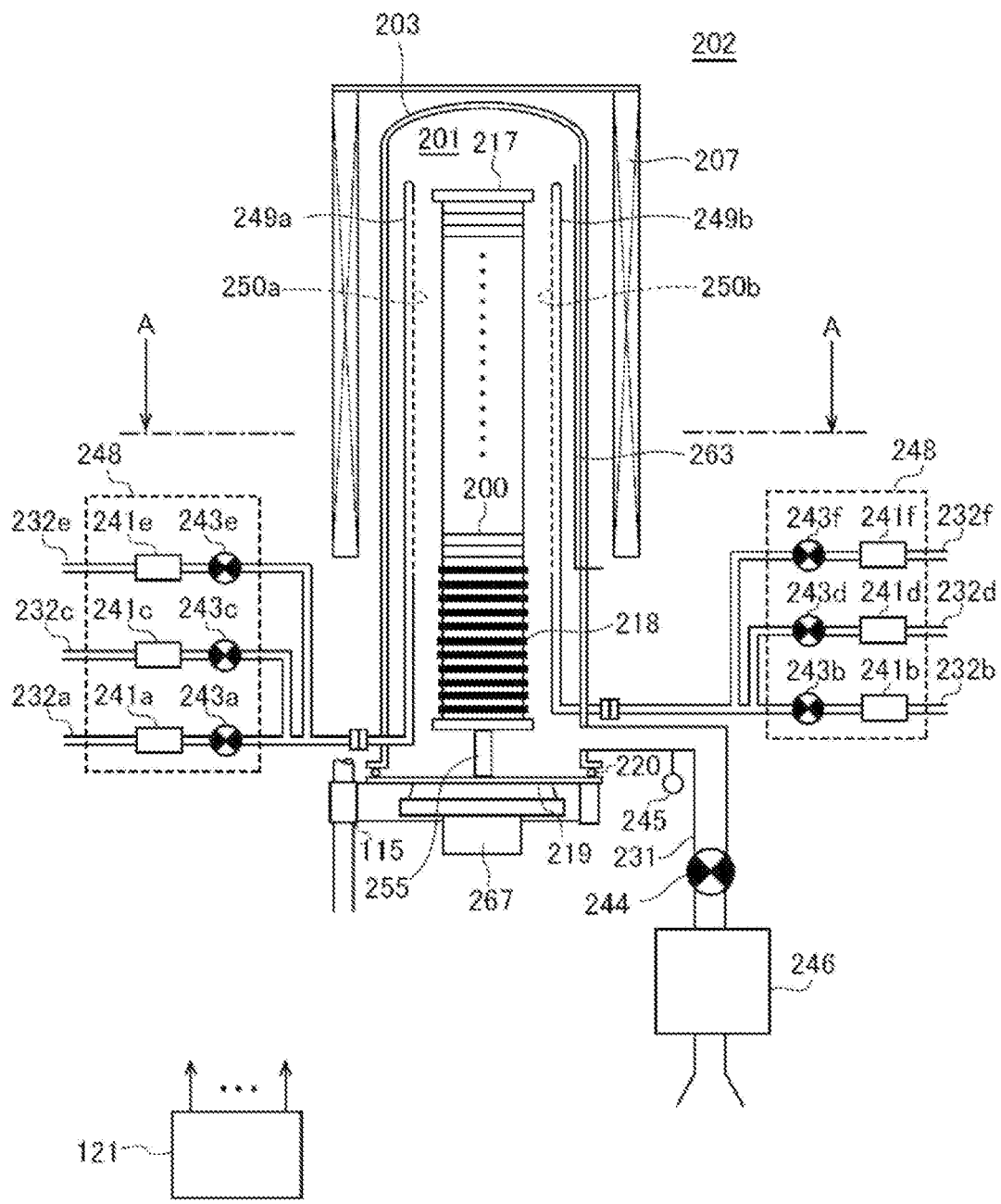
FIG. 1 is a schematic configuration view of a vertical process furnace of a substrate processing apparatus suitably used in an embodiment of the present disclosure, in which a portion of the process furnace is shown in a vertical cross section.

As shown in FIG. 1, a process furnace 202 includes a heater 207 as a heating mechanism (a temperature regulator). The heater 207 has a cylindrical shape and is supported by a support plate so as to be vertically installed. The heater 207 also functions as an activation mechanism (an excitation part) configured to thermally activate (excite) a gas.

A reaction tube 203 is disposed inside the heater 207 to be concentric with the heater 207. The reaction tube 203 is made of, for example, a heat resistant material such as quartz ($SiO_2$) or silicon carbide (SiC), and has a cylindrical shape with its upper end closed and its lower end opened. A process chamber 201 is formed in a hollow cylindrical portion of the reaction tube 203. The process chamber 201 is configured to accommodate wafers 200 as substrates. Processing on the wafers 200 is performed in the process chamber 201.

Nozzles 249a and 249b are provided in the process chamber 201 so as to penetrate through a sidewall of the reaction tube 203. Gas supply pipes 232a and 232b are connected to the nozzles 249a and 249b, respectively.

Mass flow controllers (MFCs) 241a and 241b, which are flow rate controllers (flow rate control parts), and valves 243a and 243b, which are opening/closing valves, are provided in the gas supply pipes 232a and 232b, respectively, sequentially from the upstream side. Gas supply pipes 232c to 232f are connected to the gas supply pipes 232a and 232b at the downstream sides of the valves 243a and 243b. MFCs 241c to 241f and valves 243c to 243f are provided in the gas supply pipes 232c to 232f, respectively, sequentially from the upstream side. The gas supply pipes 232a to 232f are made of, for example, a metal material such as stainless steel (SUS).

Figure 2:
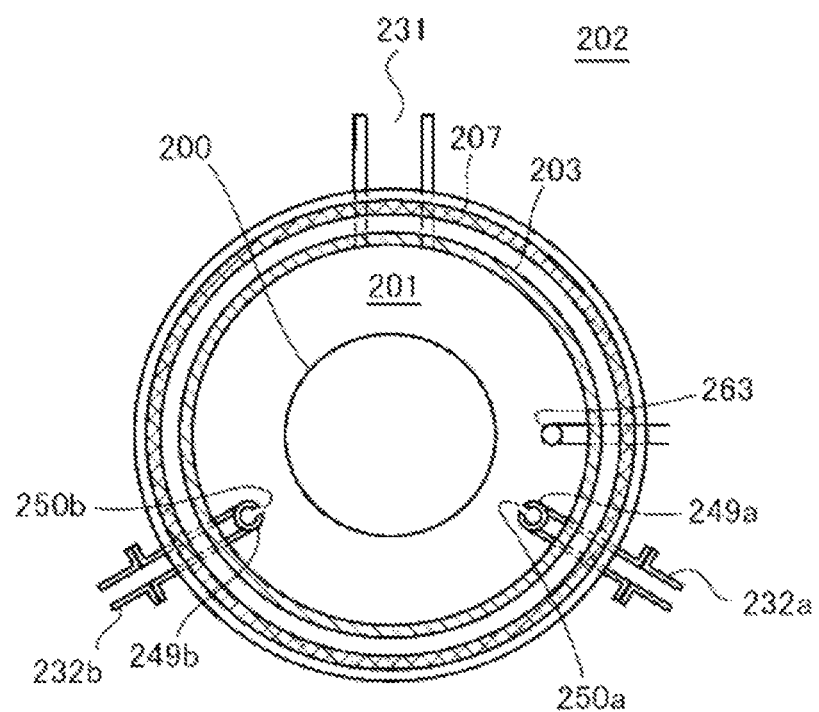
FIG. 2 is a schematic configuration view of the vertical process furnace of the substrate processing apparatus suitably used in the embodiment of the present disclosure, in which a portion of the process furnace is shown in a cross section taken along line A-A in FIG. 1.

As shown in FIG. 2, each of the nozzles 249a and 249b is disposed in an annular space in a plane view between an inner wall of the reaction tube 203 and the wafers 200 so as to extend upward from a lower portion of the inner wall of the reaction tube 203 to an upper portion thereof, that is, along an arrangement direction of the wafers 200. Specifically, each of the nozzles 249a and 249b is provided in a region horizontally surrounding a wafer arrangement region in which the wafers 200 are arranged at a lateral side of the wafer arrangement region, along the wafer arrangement region. Gas supply holes 250a and 250b for supplying a gas are formed on the side surfaces of the nozzles 249a and 249b, respectively. Each of the gas supply holes 250a and 250b is opened toward the centers of the reaction tube 203, which enables a gas to be supplied toward the wafers 200. A plurality of gas supply holes 250a and 250b are formed from the lower portion of the reaction tube 203 to the upper portion thereof. The nozzles 249a and 249b are made of, for example, a heat resistant material such as quartz or SiC.

A first precursor (first precursor gas) containing silicon (Si), which is a main element constituting a film to be formed on the wafers 200, is supplied from the gas supply pipe 232a into the process chamber 201 via the MFC 241a, the valve 243a, and the nozzle 249a. The precursor gas refers to a gaseous precursor, for example, a gas obtained by vaporizing a precursor which remains in a liquid state at room temperature and atmospheric pressure, or a precursor which remains in a gas state at room temperature and atmospheric pressure. An example of the first precursor gas may include a trisilylamine (N(SiH$_3$)$_3$, abbreviation: TSA) gas, which is a gas that contains a chemical bond (Si—N bond) of Si and nitrogen (N) and does not contain an alkyl group such as a methyl group, an ethyl group, a propyl group, an isopropyl group, a butyl group, or an isobutyl group. As shown in a chemical structural formula in FIG. 5A, TSA is a substance containing a Si—N bond and a chemical bond (Si—H bond) of Si and hydrogen (H), and contains three Si—N bonds and nine Si—H bonds in one molecule. TSA is also a precursor that does not contain halogen such as chlorine (Cl), fluorine (F), bromine (Br), or iodine (I). Three Sis are bonded to one N (center element) in TSA. TSA also acts as a Si source or a N source.

A pseudo-catalyst (pseudo-catalyst gas) is supplied from the gas supply pipe 232b into the process chamber 201 via the MFC 241b, the valve 243b, and the nozzle 249b. An example of the pseudo-catalyst gas may include a trichloroborane (BCl$_3$) gas, which is a kind of haloborane containing boron (B) and Cl as halogen. The BCl$_3$ gas exerts a catalytic action that promotes formation of a film on a wafer 200 in a substrate processing process to be described later. Here, the "catalyst" is a substance that does not change itself before and after a chemical reaction, but changes the rate of the reaction. The BCl$_3$ gas in the reaction system of the present embodiment has a catalytic action that changes the reaction rate and the like, but itself may change before and after the chemical reaction. For example, when the BCl$_3$ gas reacts with the TSA gas, a portion of the molecular structure may be decomposed and the BCl$_3$ gas itself may change before and after the chemical reaction. That is, the BCl$_3$ gas in the reaction system of the present embodiment has a catalytic action, but is not strictly a "catalyst." In this manner, a substance that acts like a "catalyst" but changes itself before and after a chemical reaction is referred to as a "pseudo-catalyst" in the present disclosure.

A second precursor (second precursor gas) containing Si, which is a main element constituting a film to be formed on the wafers 200, is supplied from the gas supply pipe 232c into the process chamber 201 via the MFC 241c, the valve 243c, the gas supply pipe 232a, and the nozzle 249a. An example of the second precursor gas may include a 1,4-disilabutane (SiH$_3$CH$_2$CH$_2$SiH$_3$, abbreviation: 1,4-DSB) gas, which is a gas that contains a chemical bond (Si—C bond) of Si and carbon (C) and does not contain halogen. As shown in a chemical structural formula in FIG. 6B, 1,4-DSB is a substance containing a Si—C bond, a Si—H bond, a chemical bond (C—H bond) of C and H, and the like, and contains two Si—C bonds, six Si—H bonds, and four C—H bonds in one molecule. 1,4-DSB is also a precursor that contains an ethylene group (C$_2$H$_4$) as an alkylene group and does not contain an alkyl group to be described later. Of four bonding hands that C has in 1,4-DSB, one constitutes a Si—C bond and two constitutes a C—H bond. In the present disclosure, 1,4-DSB is also simply referred to as DSB. DSB acts as a Si source or a C source.

A reactant (reaction gas), for example, an oxygen (O)-containing gas, is supplied from the gas supply pipe 232d into the process chamber 201 via the MFC 241d, the valve 243d, the gas supply pipe 232b, and the nozzle 249b. The O-containing gas acts as an oxidizer (oxidizing gas), that is, an O source. An example of the O-containing gas may include an oxygen (O$_2$) gas.

An inert gas, for example, a nitrogen (N$_2$) gas, is supplied from the gas supply pipes 232e and 232f into the process chamber 201 via the MFCs 241e and 241f, the valves 243e and 243f, the gas supply pipes 232a and 232b, and the nozzles 249a and 249b, respectively. The N$_2$ gas acts as a purge gas, a carrier gas, a dilution gas, or the like.

A precursor supply system mainly includes the gas supply pipes 232a and 232c, the MFCs 241a and 241c, and the valves 243a and 243c. A pseudo-catalyst supply system mainly includes the gas supply pipe 232b, the MFC 241b, and the valve 243b. A reactant supply system mainly includes the gas supply pipe 232d, the MFC 241d, and the valve 243d. An inert gas supply system mainly includes the gas supply pipes 232e and 232f, the MFCs 241e and 241f, and the valves 243e and 243f.

One or all of the above-described various supply systems may be configured as an integrated-type supply system 248 in which the valves 243a to 243f, the MFCs 241a to 241f, and so on are integrated. The integrated-type supply system 248 is connected to each of the gas supply pipes 232a to 232f. In addition, the integrated-type supply system 248 is configured such that operations of supplying various gases into the gas supply pipes 232a to 232f (that is, the opening/closing operation of the valves 243a to 243f, the flow rate adjustment operation by the MFCs 241a to 241f, and the like) are controlled by a controller 121 which will be described later. The integrated-type supply system 248 is configured as an integral type or detachable-type integrated unit, and may be attached to and detached from the gas supply pipes 232a to 232f and the like on an integrated unit basis, so that the maintenance, replacement, extension, etc. of the integrated-type supply system 248 can be performed on an integrated unit basis.

An exhaust pipe 231 for discharging (exhausting) an internal atmosphere of the process chamber 201 is connected below the sidewall of the reaction tube 203. A vacuum exhaust device, for example, a vacuum pump 246, is connected to the exhaust pipe 231 via a pressure sensor 245, which is a pressure detector (pressure detecting part) for detecting the internal pressure of the process chamber 201, and an auto pressure controller (APC) valve 244, which is a pressure regulator (pressure adjustment part). The APC valve 244 is configured to perform or stop a vacuum exhausting operation in the process chamber 201 by opening/closing the valve while the vacuum pump 246 is actuated, and is also configured to adjust the internal pressure of the process chamber 201 by adjusting an opening degree of the valve based on pressure information detected by the pressure sensor 245 while the vacuum pump 246 is actuated. A exhaust system (discharge system) mainly includes the exhaust pipe 231, the pressure sensor 245, and the APC valve 244. The exhaust system may include the vacuum pump 246.

A seal cap 219, which serves as a furnace opening cover configured to hermetically seal a lower end opening of the reaction tube 203, is provided under the reaction tube 203. The seal cap 219 is made of, for example, a metal material such as SUS, and is formed in a disc shape. An O-ring 220, which is a seal making contact with the lower end portion of the reaction tube 203, is provided on an upper surface of the seal cap 219. A rotator 267 configured to rotate a boat 217, which will be described later, is installed under the seal cap 219. A rotary shaft 255 of the rotator 267 is made of, for example, a metal material such as SUS, and is connected to the boat 217 through the seal cap 219. The rotator 267 is configured to rotate the wafers 200 by rotating the boat 217. The seal cap 219 is configured to be vertically moved up and down by a boat elevator 115 which is an elevating mechanism installed outside the reaction tube 203. The boat elevator 115 is configured as a transfer system (transfer mechanism) which loads/unloads (transfers) the wafers 200 into/out of the process chamber 201 by moving the seal cap 219 up and down.

The boat 217 serving as a substrate support is configured to support a plurality of wafers 200, for example, 25 to 200 wafers, in such a state that the wafers 200 are arranged in a horizontal posture and in multiple stages along a vertical direction with the centers of the wafers 200 aligned with one another. As such, the boat 217 is configured to arrange the wafers 200 to be spaced apart from each other. The boat 217 is made of, for example, a heat resistant material such as quartz or SiC. Heat insulating plates 218 made of a heat resistant material such as quartz or SiC are installed below the boat 217 in multiple stages.

A temperature sensor 263 serving as a temperature detector is installed in the reaction tube 203. Based on temperature information detected by the temperature sensor 263, a state of supplying electric power to the heater 207 is adjusted such that an interior of the process chamber 201 has a desired temperature distribution. The temperature sensor 263 is provided along the inner wall of the reaction tube 203.

Figure 3:
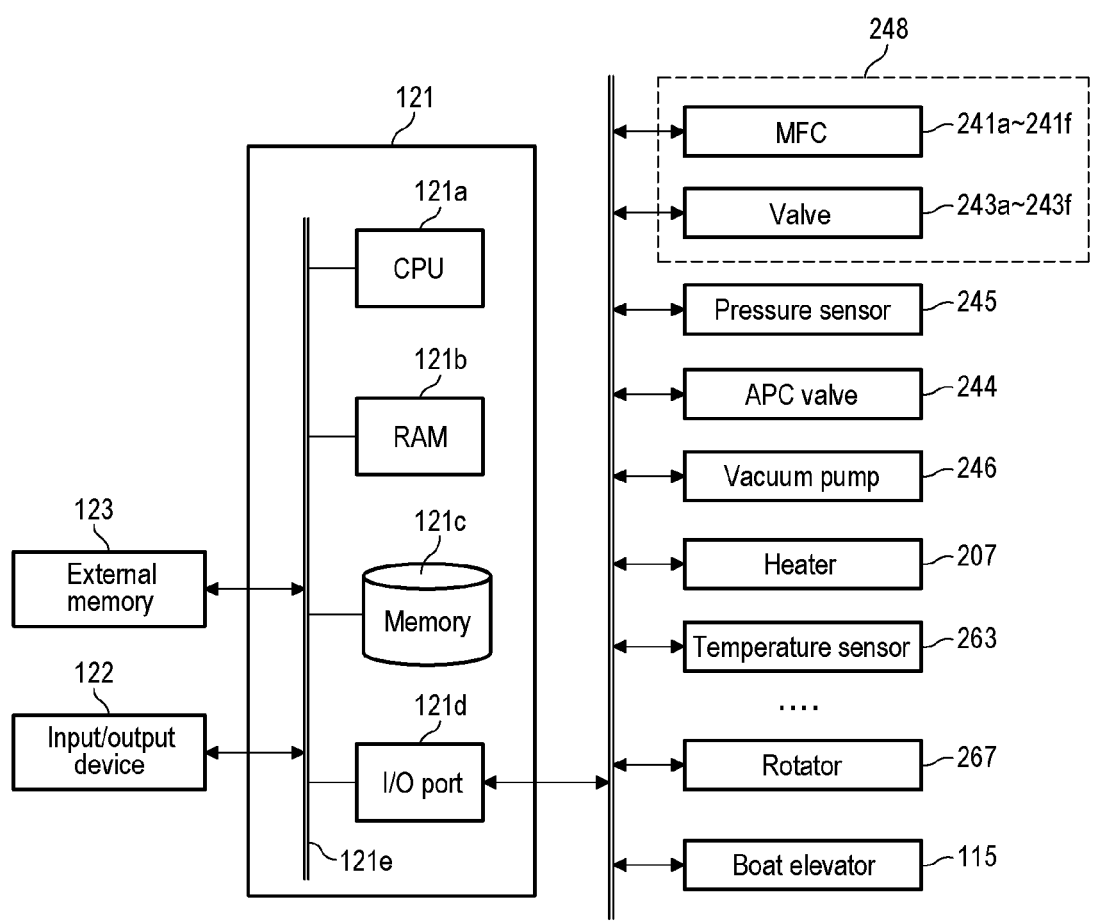
FIG. 3 is a schematic configuration diagram of a controller of the substrate processing apparatus suitably used in the embodiment of the present disclosure, in which a control system of the controller is shown in a block diagram.

As shown in FIG. 3, a controller 121, which is a control part (control means), is configured as a computer including a central processing unit (CPU) 121a, a random access memory (RAM) 121b, a memory 121c, and an I/O port 121d. The RAM 121b, the memory 121c, and the I/O port 121d are configured to be capable of exchanging data with the CPU 121a via an internal bus 121e. An input/output device 122 configured as, e.g., a touch panel or the like, is connected to the controller 121.

The memory 121c is configured by, for example, a flash memory, a hard disk drive (HDD), or the like. A control program for controlling operations of a substrate processing apparatus, a process recipe in which sequences and conditions of a film-forming process to be described later are written, etc. are readably stored in the memory 121c. The process recipe functions as a program for causing the controller 121 to execute each sequence in the film-forming process, which will be described later, to obtain an expected result. Hereinafter, the process recipe and the control program may be generally and simply referred to as a "program." Furthermore, the process recipe may be simply referred to as a "recipe." When the term "program" is used herein, it may indicate a case of including the recipe only, a case of including the control program only, or a case of including both the recipe and the control program. The RAM 121b is configured as a memory area (work area) in which a program or data read by the CPU 121a is temporarily stored.

The I/O port 121d is connected to the MFCs 241a to 241f, the valves 243a to 243f, the pressure sensor 245, the APC valve 244, the vacuum pump 246, the temperature sensor 263, the heater 207, the rotator 267, the boat elevator 115, and so on.

The CPU 121a is configured to read and execute the control program from the memory 121c and is also configured to read the recipe from the memory 121c according to an input of an operation command from the input/output device 122. The CPU 121a is configured to control the flow rate adjusting operation of various kinds of gases by the MFCs 241a to 241f, the opening/closing operation of the valves 243a to 243f, the opening/closing operation of the APC valve 244, the pressure adjusting operation performed by the APC valve 244 based on the pressure sensor 245, the actuating and stopping operation of the vacuum pump 246, the temperature adjusting operation performed by the heater 207 based on the temperature sensor 263, the operation of rotating the boat 217 with the rotator 267 and adjusting the rotation speed of the boat 217, the operation of moving the boat 217 up and down by the boat elevator 115, and so on, according to contents of the read recipe.

The controller 121 may be configured by installing, on the computer, the aforementioned program stored in an external memory 123. Examples of the external memory 123 may include a magnetic disk such as a HDD, an optical disc such as a CD, a magneto-optical disc such as a MO, a semiconductor memory such as a USB memory, and the like. The memory 121c or the external memory 123 is configured as a non-transitory computer-readable recording medium. Hereinafter, the memory 121c and the external memory 123 may be generally and simply referred to as a "recording medium." When the term "recording medium" is used herein, it may indicate a case of including the memory 121c only, a case of including the external memory 123 only, or a case of including both the memory 121c and the external memory 123. Furthermore, the program may be provided to the computer using communication means such as the Internet or a dedicated line, instead of using the external memory 123.

(2) Substrate Processing Process

As a process of manufacturing a semiconductor device using the above-described substrate processing apparatus, a substrate processing sequence example of forming a silicon nitride film (SiN film) on a wafer 200 as a substrate, that is, a film-forming sequence example, will be described with reference to FIG. 4. In addition, in the present embodiment, an example in which a substrate having a recess such as a trench or a hole formed on the surface of the substrate is used as the wafer 200 will be described. In the following descriptions, the operations of the respective parts constituting the substrate processing apparatus are controlled by the controller 121.

Figure 4:
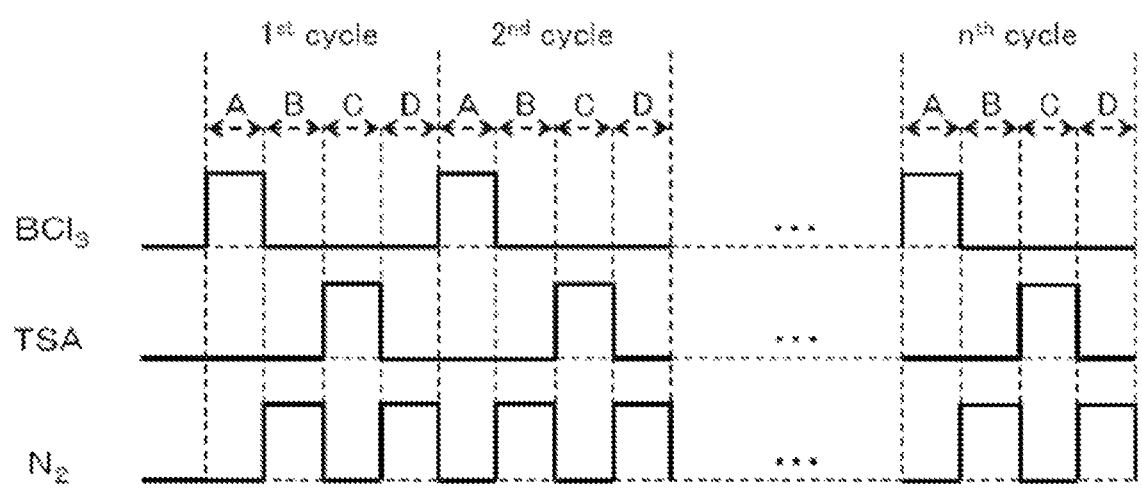
FIG. 4 is a diagram showing a gas supply sequence in a substrate processing process in an embodiment of the present disclosure.

The substrate processing sequence shown in FIG. 4 includes:
a step of forming a SiN film as a film so as to be embedded in a recess formed on a surface of a wafer 200 by performing a cycle a predetermined number of times (n times, where n is an integer of 1 or more), the cycle including:
a step A of supplying a $BCl_3$ gas as a pseudo-catalyst to the wafer 200 in the process chamber 201;
a step B of exhausting the $BCl_3$ gas remaining in the process chamber 201;
a step C of supplying a TSA gas as a precursor to the wafer 200 in the process chamber 201; and
a step D of exhausting the TSA gas remaining in the process chamber 201,
wherein in step A, $BCl_3$ is adsorbed on the surface of the wafer 200 under a condition that chemical adsorption of $BCl_3$ on the surface of the wafer 200 is unsaturated.

In the present disclosure, the gas supply sequence shown in FIG. 4 may be denoted as follows for the sake of convenience. The same notation will be used in description of the following modifications and other embodiments.

($BCl_3$→P→TSA→P)×n⇒SiN

When the term "wafer" is used in the present disclosure, it may refer to "a wafer itself" or "a wafer and a laminated body of certain layers or films formed on a surface of the wafer." When the phrase "a surface of a wafer" is used in the present disclosure, it may refer to "a surface of a wafer itself" or "a surface of a certain layer formed on a wafer." When the expression "a certain layer is formed on a wafer" is used in the present disclosure, it may mean that "a certain layer is formed directly on a surface of a wafer itself" or that "a certain layer is formed on a layer formed on a wafer." When the term "substrate" is used in the present disclosure, it may be synonymous with the term "wafer."

(Wafer Charging and Boat Loading)

The boat 217 is charged with a plurality of wafers 200 (wafer charging). Thereafter, as shown in FIG. 1, the boat 217 charged with the wafers 200 is lifted up by the boat elevator 115 to be loaded into the process chamber 201 (boat loading). In this state, the seal cap 219 seals the lower end of the reaction tube 203 through the O-ring 220.

(Pressure Adjustment and Temperature Adjustment)

The interior of the process chamber 201, that is, a space where the wafers 200 are placed, is vacuum-exhausted (decompression-exhausted) by the vacuum pump 246 to reach a desired pressure (degree of vacuum). At this time, the internal pressure of the process chamber 201 is measured by the pressure sensor 245, and the APC valve 244 is feedback-controlled based on the measured pressure information (pressure adjustment). Further, the wafers 200 in the process chamber 201 are heated by the heater 207 so as to have a desired processing temperature. At this time, the state of supplying electric power to the heater 207 is feedback-controlled based on the temperature information detected by the temperature sensor 263 so that the interior of the process chamber 201 has a desired temperature distribution. Further, the rotation of the wafers 200 by the rotator 267 is started. The operation of the vacuum pump 246 and the heating and rotation of the wafers 200 are continuously performed at least until the processing on the wafers 200 is completed.

(Film-Forming Step)

After that, steps A to D to be described below are executed sequentially.

[Step A]

In this step, a $BCl_3$ gas is supplied to a wafer 200 in the process chamber 201. Specifically, the valve 243b is opened to allow the $BCl_3$ gas to flow into the gas supply pipe 232b. The flow rate of the $BCl_3$ gas is adjusted by the MFC 241b, and the $BCl_3$ gas is supplied into the process chamber 201 via the nozzle 249b and is exhausted through the exhaust pipe 231. In this operation, the $BCl_3$ gas is supplied to the wafer 200. At this time, the valves 243e and 243f may be opened to allow a $N_2$ gas to flow into the gas supply pipes 232e and 232f.

Figure 7A:
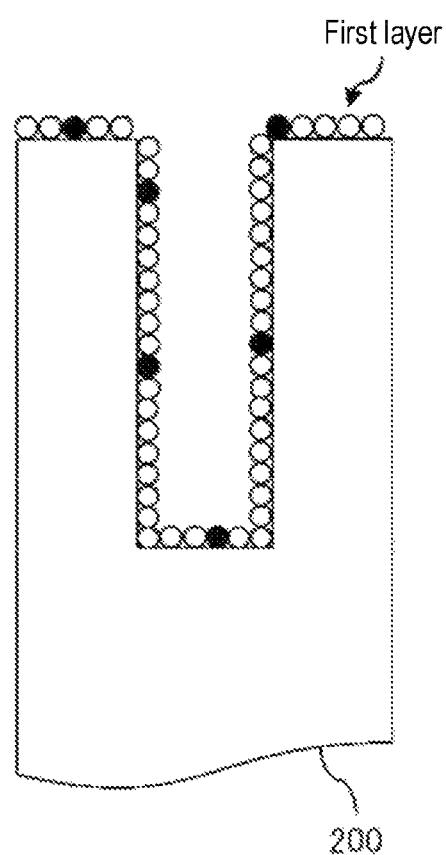
FIG. 7A is a partially-enlarged cross-sectional view of the surface of a wafer after a pseudo-catalyst is supplied to the wafer in a process chamber.

In this step, the $BCl_3$ gas is supplied to the wafer 200 so as to adsorb $BCl_3$ on the surface of the wafer 200 under a condition that chemical adsorption of $BCl_3$ on the surface of the wafer 200 becomes unsaturated. By supplying the $BCl_3$ gas to the wafer 200 under such a condition, it is possible to adsorb $BCl_3$ on the outermost surface of the wafer 200 without saturating the chemical adsorption of $BCl_3$ on the outermost surface of the wafer 200. As a result, as shown in FIG. 7A, it is possible to form a layer containing adsorption components of $BCl_3$ as a first layer (initial layer), that is, a layer containing B and Cl, on the wafer 200, specifically in a recess formed on the wafer 200. Further, at this time, it is preferable to supply the $BCl_3$ gas under a condition that the decomposition of the $BCl_3$ gas in a gas phase (gas phase decomposition) in the process chamber 201, that is, the thermal decomposition, can be suppressed. This makes it easy to realize each condition and each adsorption state, which will be described later.

In FIG. 7A, ○ indicates a physical adsorption component of $BCl_3$, and ● indicates a chemical adsorption component of $BCl_3$. The physical adsorption component of $BCl_3$ is $BCl_3$ physically adsorbed on the wafer 200. The chemical adsorption component of $BCl_3$ is a substance produced by chemically adsorbing B contained in $BCl_3$ on the wafer 200. When B contained in $BCl_3$ is chemically adsorbed on the surface of the wafer 200, most of Cls bonded to B contained in $BCl_3$ are maintained, but some Cls are desorbed. The adsorption state of the chemical adsorption component of $BCl_3$ is more stable than the adsorption state of the physical adsorption component of $BCl_3$, and therefore, when step B to be described later is performed, it becomes an adsorption state that is difficult to desorb from the surface of the wafer 200 more than the physical adsorption component of $BCl_3$.

These substances (the physical adsorption component and the chemical adsorption component of $BCl_3$) adsorbed on the surface of the wafer 200 act as a pseudo-catalyst to advance a film-forming reaction (formation reaction of a second layer, which will be described later) on the surface of the wafer 200 in step C to be described later. Hereinafter, these substances acting as the pseudo-catalyst are also referred to as $BCl_x$ (x is 1 to 3) for the sake of convenience. Further, the first layer acting as the pseudo-catalyst is also referred to as a pseudo-catalyst layer.

As described above, in this step, $BCl_3$ is adsorbed on the surface of the wafer 200 under a condition that the chemical adsorption of $BCl_3$ on the surface of the wafer 200 becomes unsaturated. As shown in FIG. 7A, the adsorption components of $BCl_3$ on the surface of the wafer 200 in this step include at least physical adsorption components. As shown in this figure, the adsorption components of BCl$_3$ on the surface of the wafer 200 in this step may include both physical adsorption components and chemical adsorption components. Further, depending on conditions, the adsorption components of BCl$_3$ on the surface of the wafer 200 in this step may not contain the chemical adsorption components but may contain the physical adsorption components.

Further, this step can be performed under a condition that the physical adsorption components of BCl$_3$ are present in both an upper portion and a lower portion of a recess formed on the surface of the wafer 200. In this case, the adsorption components of BCl$_3$ on the surface of the wafer 200 in this step include at least physical adsorption components in each of the upper portion and the lower portion of the recess formed on the surface of the wafer 200.

Further, this step can be performed under a condition that both the physical adsorption components and the chemical adsorption components of BCl$_3$ are present in both the upper portion and the lower portion of the recess formed on the surface of the wafer 200. In this case, the adsorption components of BCl$_3$ on the surface of the wafer 200 in this step includes both the physical adsorption components and the chemical adsorption components in each of the upper portion and the lower portion of the recess formed on the surface of the wafer 200.

Further, this step can be performed under a condition that the chemical adsorption components of BCl$_3$ are not present and the physical adsorption components of BCl$_3$ are present in both the upper portion and the lower portion of the recess formed on the surface of the wafer 200. In this case, the adsorption components of BCl$_3$ on the surface of the wafer 200 in this step do not include the chemical adsorption components but include the physical adsorption components in each of the upper portion and the lower portion of the recess formed on the surface of the wafer 200.

Further, in this step, the BCl$_3$ gas can be supplied to the wafer 200 under a condition that the adsorption reaction of BCl$_3$ with the surface of the wafer 200 is reaction rate controlling. Further, in this step, the BCl$_3$ gas can be supplied to the wafer 200 under a condition that the film formation does not proceed if the BCl$_3$ gas is present alone in the process chamber 201. In these cases, for example, excessive consumption of the BCl$_3$ gas in the upper portion and the like of the recess formed on the surface of the wafer 200 can be suppressed, and the BCl$_3$ gas can be reliably supplied to the lower portion of the recess. As a result, it is possible to form the first layer exhaustively from the upper portion to the lower portion of the recess formed on the surface of the wafer 200.

The process conditions of this step are exemplified as follows.

BCl$_3$ gas supply flow rate: 1 to 5,000 sccm, specifically 5 to 500 sccm

N$_2$ gas supply flow rate (for each gas supply pipe): 0 to 10,000 sccm

Each gas supply time: 1 to 60 seconds, specifically 1 to 30 seconds

Processing temperature: 200 to 500 degrees C., specifically 300 to 450 degrees C.

Processing pressure: 20 to 1,000 Pa, specifically 30 to 500 Pa

In the present disclosure, the notation of a numerical range such as "200 to 500 degrees C." means that the lower limit value and the upper limit value are included in the range. Therefore, for example, "200 to 500 degrees C." means "200 degrees C. or higher and 500 degrees C. or lower." The same applies to other numerical ranges.

By appropriately adjusting each process condition within such a process condition range, each of the above-mentioned conditions can be realized, and accordingly, it is possible to realize each of the above-mentioned adsorption states of BCl$_3$ in the recess.

If the processing temperature is less than 200 degrees C., BCl$_3$ may be difficult to be adsorbed on the surface of the wafer 200, which may deteriorate the film formation rate. By setting the processing temperature to a temperature of 200 degrees C. or higher, this can be solved. By setting the processing temperature to a temperature of 300 degrees C. or higher, this can be reliably solved.

If the processing temperature exceeds 500 degrees C., BCl$_3$ gas may be excessively consumed in the upper portion and the like of the recess formed on the surface of the wafer 200, and accordingly, it may be difficult to supply BCl$_3$ gas to the lower portion of the recess. In this case, it may be difficult to realize each of the above-mentioned adsorption states of BCl$_3$ in the recess. By setting the processing temperature to a temperature of 500 degrees C. or lower, this can be solved. By setting the processing temperature to 450 degrees C. or lower, this can be reliably solved.

If the processing pressure is less than 20 Pa, it may be difficult to efficiently supply (reach) the BCl$_3$ gas to the lower portion of the recess formed on the surface of the wafer 200. By setting the processing pressure to a pressure of 20 Pa or more, this can be solved. By setting the processing pressure to a pressure of 30 Pa or more, this can be reliably solved.

If the processing pressure exceeds 1,000 Pa, the chemical adsorption of BCl$_3$ on the surface of the wafer 200 may be easily saturated. By setting the processing pressure to a pressure of 1,000 Pa or less, this can be solved. By setting the processing pressure to a pressure of 500 Pa or less, this can be reliably solved.

As the pseudo-catalyst gas, in addition to the BCl$_3$ gas, a trifluoroborane (BF$_3$) gas, a tribromoborane (BBr$_3$) gas, a triiodoborane (BI$_3$) gas, a trimethylborane (B(CH$_3$)$_3$) gas, a triethylborane (B(C$_2$H$_5$)$_3$) gas, or the like can be used.

As the inert gas, in addition to the N$_2$ gas, a rare gas such as an Ar gas, a He gas, a Ne gas, or a Xe gas can be used. This point is the same in steps B to D and the like, which will be described later.

[Step B]

After the first layer is formed on the wafer 200, the valve 243b is closed to stop the supply of the BCl$_3$ gas into the process chamber 201. Then, the interior of the process chamber 201 is vacuum-exhausted to discharge the BCl$_3$ gas and the like remaining in the process chamber 201 from the interior of the process chamber 201. At this time, the valves 243e and 243f are opened to allow a N$_2$ gas to be supplied into the process chamber 201. The N$_2$ gas acts as a purge gas. These make it possible to remove the BCl$_3$ gas floating in the process chamber 201. As a result, it is possible to perform step C, which will be described later, in a state where the BCl$_3$ gas is not floated (non-floating state) in the process chamber 201.

In the present embodiment, as will be described later, this step can be performed under a condition that at least a portion of physical adsorption components of BCl$_3$ on the surface of the wafer 200 remains. For example, this step can be performed under a condition that at least a portion of physical adsorption components of BCl$_3$ on the lower portion of the recess formed on the surface of the wafer 200 remains while at least a portion of physical adsorption components of BCl$_3$ on the upper portion of the recess is desorbed. Further, for example, this step can be performed under a condition that an amount of desorption of the physical adsorption components of $BCl_3$ on the upper portion of the recess formed on the surface of the wafer 200 is larger than an amount of desorption of the physical adsorption components of $BCl_3$ on the lower portion of the recess.

Figure 7B:
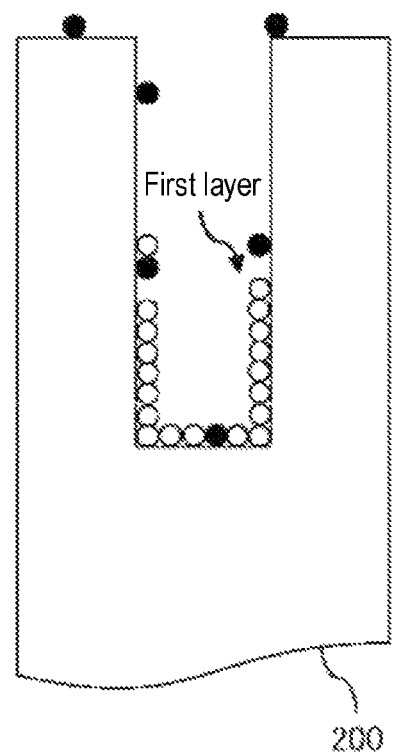
FIG. 7B is a partially-enlarged cross-sectional view of the surface of the wafer after the pseudo-catalyst remaining in the process chamber is exhausted.

By performing this step under such conditions, as shown in FIG. 7B, it is possible to leave at least a portion of physical adsorption components of $BCl_3$ on the surface of the wafer 200. Further, it is possible to make a residual amount of the physical adsorption components of $BCl_3$ on the lower portion of the recess formed on the surface of the wafer 200 larger than a residual amount of the physical adsorption components of $BCl_3$ on the upper portion of this recess.

The process conditions of this step are exemplified as follows.
- $N_2$ gas supply flow rate: 1 to 10,000 sccm
- $N_2$ gas supply time: 1 to 60 seconds, specifically 5 to 30 seconds
- Processing pressure: 1 to 1,000 Pa, specifically 30 to 500 Pa, more specifically 100 to 500 Pa
- Other process conditions are the same as the process conditions in step A.

By appropriately adjusting each process condition within such a process condition range, each of the above-mentioned conditions can be realized, and accordingly, it is possible to realize the above-mentioned residual state of the physical adsorption components of $BCl_3$ in the recess.

If the processing pressure is less than 10 Pa, it may be difficult to leave the physical adsorption components of $BCl_3$ on the surface of the wafer 200. For example, it may be difficult to remain at least a portion of physical adsorption components of $BCl_3$ on the lower portion of the recess formed on the surface of the wafer 200 while desorbing at least a portion of the physical adsorption components of $BCl_3$ on the upper portion of this recess. By setting the processing pressure to a pressure of 10 Pa or more, this can be solved. By setting the processing pressure to a pressure of 30 Pa or more, more specifically 100 Pa or more, this can be reliably solved.

If the processing pressure exceeds 1,000 Pa, it may be difficult to exhaust the $BCl_3$ gas and the like from the process chamber 201, and accordingly, in step C to be described later, foreign matter may be generated in the process chamber 201 due to a gas phase reaction between a $BCl_3$ gas and a TSA gas floating in the process chamber 201. By setting the processing pressure to a pressure of 1,000 Pa or less, this can be solved. By setting the processing pressure to a pressure of 500 Pa or less, this can be reliably solved.

[Step C]

In this step, in a state where the $BCl_3$ gas is not floated in the process chamber 201, a TSA gas is supplied to the wafer 200, that is, the first layer formed on the wafer 200, in the process chamber 201. Specifically, the opening/closing control of the valves 243a, 243e, and 243f is performed in the same procedure as the opening/closing control of the valves 243b, 243e, and 243f in step A. The flow rate of the TSA gas is controlled by the MFC 241a, and the TSA gas is supplied into the process chamber 201 via the nozzle 249a and is exhausted through the exhaust pipe 231. In this operation, the TSA gas is supplied to the wafer 200.

The process conditions of this step are exemplified as follows.
- TSA gas supply flow rate: 1 to 2,000 sccm
- TSA gas supply time: 1 to 300 seconds
- Processing pressure: 1 to 2,000 Pa
- Other process conditions are the same as the process conditions in step A.

Figure 7C:
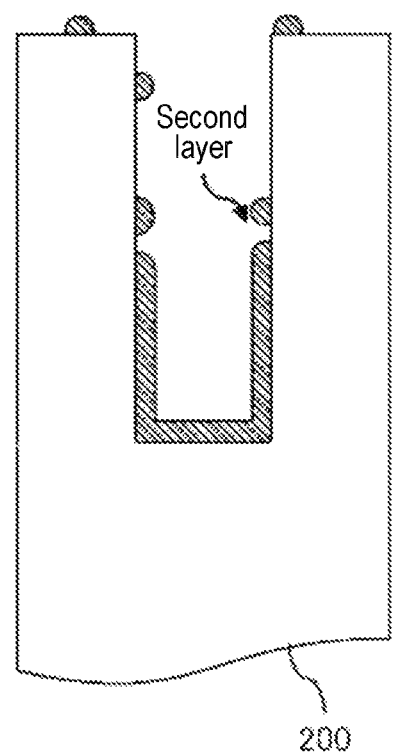
FIG. 7C is a partially-enlarged cross-sectional view of the surface of the wafer after a precursor is supplied to the wafer in the process chamber.
Figure 7C:

By supplying the TSA gas to the wafer 200 under the above-mentioned conditions, a pseudo-catalytic reaction is caused by the pseudo-catalytic action of $BCl_x$ contained in the first layer, which makes it possible to decompose a portion of the molecular structure of TSA. Then, a substance produced by decomposing a portion of the molecular structure of TSA, for example, an intermediate containing a Si—N bond and the like, can be adsorbed (chemically adsorbed) on the surface of the wafer 200. As a result, as shown in FIG. 7C, it is possible to form a silicon nitride layer (SiN), which is a layer containing Si and N, as a second layer, on the wafer 200, that is, in the recess formed on the surface of the wafer 200. In FIG. 7C, a shaded portion indicates the second layer.

Figure 5A:
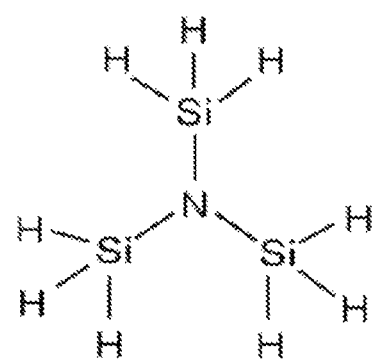
FIG. 5A is a view showing a chemical structural formula of trisilylamine.

The TSA gas has a property of being difficult to be adsorbed on the surface of the wafer 200 because it is terminated by a Si—H bond, as shown in FIG. 5A, but a portion of the molecular structure thereof is decomposed (for example, some of Si—H bonds are cut) by utilizing the above-mentioned pseudo-catalyst action of $BCl_x$ to be efficiently adsorbed on the surface of the wafer 200. That is, the formation of the second layer proceeds by the pseudo-catalyst action of $BCl_x$ contained in the first layer, and proceeds mainly by a surface reaction rather than a gas phase reaction. At this time, since the $BCl_3$ gas is not floated in the process chamber 201, it is possible to surely proceed with the formation of the second layer by the surface reaction rather than the gas phase reaction.

Here, as described above, in step B, at least a portion of the physical adsorption components of $BCl_3$ on the surface of the wafer 200 remains, and a residual amount of the physical adsorption components of $BCl_3$ on the lower portion of the recess formed on the surface of the wafer 200 is made larger than a residual amount of the physical adsorption components of $BCl_3$ on the upper portion of this recess. This can make the pseudo-catalyst action of $BCl_x$ generated in the lower portion of the recess formed on the surface of the wafer 200 stronger than the pseudo-catalyst action of $BCl_x$ generated in the upper portion of this recess. Then, this can make it easier to proceed with the formation reaction of the second layer generated in the lower portion of the recess formed on the wafer 200 than the formation reaction of the second layer generated in the upper portion of this recess. As a result, as shown in FIG. 7C, it is possible to make the thickness of the second layer formed in the lower portion of the recess formed on the surface of the wafer 200 thicker than the thickness of the second layer formed in the upper portion of this recess.

Further, in this step, the TSA gas can be supplied to the wafer 200 under a condition that the film formation does not proceed if the TSA gas is present alone in the process chamber 201. By performing this step under such a condition, it is possible to more reliably proceed with the formation of the second layer by a surface reaction rather than a gas phase reaction. As a result, it is possible to more reliably make the formation rate of the second layer in the lower portion of the recess formed on the wafer 200 higher than the formation rate of the second layer in the upper portion of this recess.

Further, under the above-mentioned conditions, at least some of the Si—N bonds of the TSA gas are retained without being cut. Therefore, the second layer becomes a layer containing Si and N in the form of a Si—N bond. Further, under the above-mentioned conditions, the $BCl_x$ contained in the first layer is mostly consumed during the reaction with the TSA gas. As a result, the amount of $BCl_x$ contained in the second layer is lowered to an impurity level. Since the second layer contains boron (B) of the impurity level, the second layer can also be referred to as a SiN layer containing B. The second layer may contain Cl, H, and the like as impurities in addition to B.

Figure 5B:
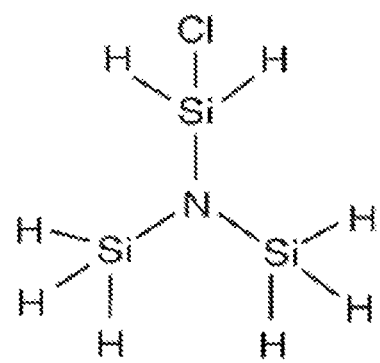
FIG. 5B is a view showing a chemical structural formula of monochlorotrisilylamine.

As the first precursor, in addition to the TSA gas, a monochlorosilylamine ($N(SiH_3)_2SiH_2Cl$) gas or the like can be used. FIG. 5B shows a chemical structural formula of monochlorosilylamine. Monochlorosilylamine is a substance that contains three Si—N bonds in one molecule and does not contain an alkyl group. As shown in FIGS. 5A and 5B, these substances include Si—H bonds and Si—N bonds. Further, these substances do not contain the following bonds, which may be a factor to cause a decrease in ashing resistance, wet etching resistance, dry etching resistance, etc. (hereinafter, collectively referred to as processing resistance) of the SiN film formed on the wafer 200, for example, a bond between carbons (C) in which C is bonded to two or more, three or more, or all (four) bonding hands (hereinafter, this bond is simply referred to as a C—C bond), a chemical bond between C and O (a C—O bond), a chemical bond between Si and an alkyl group (R) (a Si—R bond), a chemical bond between N and H (a N—H bond), and a chemical bond between N and O (a N—O bond).

[Step D]

After the second layer is formed on the wafer 200, the valve 243a is closed to stop the supply of the TSA gas into the process chamber 201. Then, according to the same processing procedure as in step B, a gas and the like remaining in the process chamber 201 are exhausted from the process chamber 201. This makes it possible to remove the TSA gas floating in the process chamber 201. As a result, it is possible to perform step A in the next cycle in a state where the TSA gas is not floated (non-floating state) in the process chamber 201.

The process conditions of this step are exemplified as follows.

$N_2$ gas supply flow rate: 10 to 10,000 sccm
$N_2$ gas supply time: 1 to 300 seconds
Processing pressure: 0.1 to 100 Pa
Other process conditions are the same as the process conditions in step A.

(Performing Predetermined Number of Times)

By performing a cycle a predetermined number of times (n times, where n is an integer of 1 or more), the cycle including non-simultaneously, that is, without synchronization, performing the above-described steps A to D, it is possible to form a SiN film having a predetermined composition and a predetermined film thickness so as to be embedded in the recess formed on the surface of the wafer 200. Since this film contains Si and N in the form of a Si—N bond and does not contain a bond which may be a factor to cause a decrease in processing resistance, the film has excellent processing resistance.

The above-mentioned cycle may be repeated multiple times. That is, the thickness of the SiN layer formed when the above-mentioned cycle is performed once may be set to be smaller than a desired film thickness, and the above-mentioned cycle may be repeated multiple times until the film thickness of a SiN film formed by laminating SiN layers reaches the desired film thickness. For the above-mentioned reason, in the film-forming step, the formation rate of the SiN layer in the lower portion of the recess formed on the wafer 200 is higher than the formation rate of the SiN layer in the upper portion of this recess. Therefore, by repeating the above-mentioned cycle a plurality of times, it is possible to form the SiN film while bottoming up from the lower portion in the recess formed on the surface of the wafer 200 toward the upper portion in this recess. As a result, the SiN film that is embedded in the recess becomes a film that does not contain voids or seams and has excellent embedding characteristics.

(After-Purging and Returning to Atmospheric Pressure)

After the film-forming step is completed, a $N_2$ gas is supplied from each of the gas supply pipes 232e and 232f into the process chamber 201 and is exhausted through the exhaust pipe 231. Thus, the interior of the process chamber 201 is purged to remove a gas, reaction by-products, and the like remaining in the process chamber 201 from the process chamber 201 (after-purge). After that, the internal atmosphere of the process chamber 201 is substituted with an inert gas (inert gas substitution) and the internal pressure of the process chamber 201 is returned to an atmospheric pressure (returning to atmospheric pressure).

(Boat Unloading and Wafer Discharging)

After that, the seal cap 219 is moved down by the boat elevator 115 to open the lower end of the reaction tube 203. Then, the processed wafers 200 supported by the boat 217 are unloaded from the lower end of the reaction tube 203 to the outside of the reaction tube 203 (boat unloading). The wafers 200 subjected to the film-forming step are discharged from the boat 217 (wafer discharging).

(3) Effects According to the Present Embodiment

According to the present embodiment, one or more effects set forth below may be achieved.

(a) According to the present embodiment, it is possible to make the formation rate of the SiN layer in the lower portion of the recess formed on the wafer 200 higher than the formation rate of the SiN layer in the upper portion of this recess. This makes it possible to form the SiN film in the recess while bottoming up, and as a result, it is possible to make the SiN film formed in the recess into a film having excellent embedding characteristics without containing voids or seams.

This is because in step A, $BCl_3$ is adsorbed on the surface of the wafer 200 under the condition that the chemical adsorption of $BCl_3$ on the surface of the wafer 200 is unsaturated. If, in step A, $BCl_3$ is adsorbed on the surface of the wafer 200 under a condition that the chemical adsorption of $BCl_3$ on the surface of the wafer 200 is saturated, $BCl_3$ is chemically adsorbed on most of the adsorption sites in the recess formed on the surface of the wafer 200, and therefore, a chemical adsorption layer of $BCl_3$ is uniformly formed on the entire surface including the upper portion and the lower portion of the recess. Since it is difficult to desorb the chemical adsorption components of $BCl_3$ with the action of a purge gas, in which case, even when step B is performed, the chemical adsorption components of $BCl_3$ will remain uniformly in the upper portion and the lower portion of this recess. This makes it difficult to make the pseudo-catalyst action of $BCl_x$ generated in the lower portion of this recess stronger than the pseudo-catalyst action of $BCl_x$ generated in the upper portion of the recess in step C. As a result, it is difficult to obtain the above-described effects.

In contrast, according to the present embodiment, in step A, since the chemical adsorption of $BCl_3$ in the recess formed on the surface of the wafer 200 is not saturated, the chemical adsorption layer of $BCl_3$ is not uniformly formed on the entire surface including the upper portion and the lower portion of the recess. Therefore, the adsorption site where $BCl_3$ is not chemically adsorbed is retained, and the amount of desorption, that is, the residual amount, of the adsorption components of $BCl_3$ can be changed as described above in the upper portion and the lower portion of the recess in step B. As a result, in step C, it is possible to make the pseudo-catalyst action of $BCl_x$ generated in the lower portion of the recess stronger than the pseudo-catalyst action of $BCl_x$ generated in the upper portion of this recess, so that the above-described effects can be appropriately obtained.

(b) According to the present embodiment, it is possible to embed the SiN film in the recess formed on the surface of the wafer 200 without performing an additional etching step in addition to the film-forming step. That is, it is possible to avoid a decrease in the productivity of substrate processing including the processing of embedding a film in the recess.

(c) According to the present embodiment, it is possible to make the SiN film formed on the wafer 200 into a film having excellent processing resistance which contains Si and N in the form of a Si—N bond and does not contain a bond which may be a factor to cause a decrease in processing resistance.

(d) The above-described effects can be obtained in the same manner even when the above-mentioned pseudo-catalyst gases other than the $BCl_3$ gas are used, when the above-mentioned first precursor gases other than the TSA gas are used, and when the above-mentioned inert gases other than the $N_2$ gas are used.

(4) Modifications

The substrate processing sequence in the present embodiment is not limited to the embodiment shown in FIG. 4, but may be changed as in the following modification. Further, these modifications can be arbitrarily combined. Further, unless otherwise stated, the processing procedure and process conditions in each step of each modification are the same as the processing procedure and process conditions in each step of the above-described substrate processing sequence.

(Modification 1)

As in the film-forming sequence shown below, a silicon carbonitride film (SiCN) may be formed as a film so as to embedded in the recess formed on the surface of the wafer 200 by performing a cycle a predetermined number of times (n times, where n is an integer of 1 or more), the cycle further including a step E of supplying a DSB gas as a second precursor to the wafer 200 in the process chamber 201 and a step F of exhausting the DSB gas remaining in the process chamber 201, in addition to steps A to D.

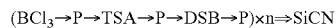

In step E, the DSB gas is supplied to the wafer 200, that is, the second layer formed on the wafer 200, in the process chamber 201. Specifically, the opening/closing control of the valves 243c, 243e, and 243f is performed in the same procedure as the opening/closing control of the valves 243b, 243e, and 243f in step A. The flow rate of the DSB gas is controlled by the MFC 241c, and the DSB gas is supplied into the process chamber 201 via the gas supply pipe 232a and the nozzle 249a and is exhausted through the exhaust pipe 231. In this operation, the DSB gas is supplied to the wafer 200. The process conditions in step E can be, for example, the same as the process conditions in step C. By supplying the DSB gas to the wafer 200 under such process conditions, it is possible to cause a pseudo-catalyst reaction by the pseudo-catalyst action of $BCl_x$ contained in the second layer, whereby a substance produced by decomposing a portion of the molecular structure of DSB, for example, an intermediate containing a Si—C bond and the like, can be adsorbed (chemically adsorbed) on the second layer. As a result, it is possible to form a silicon carbonitriding layer (SiCN layer) which is a layer containing Si, C, and N, as a third layer, in the recess formed on the wafer 200.

Figure 6A:
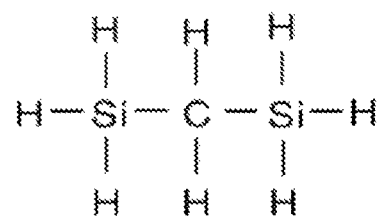
FIG. 6A is a view showing a chemical structural formula of 1,3-disilapropane.
Figure 6B:
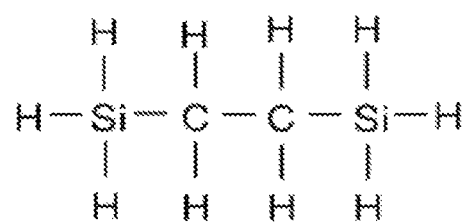
FIG. 6B is a view showing a chemical structural formula of 1,4-disilabutane.
Figure 6C:
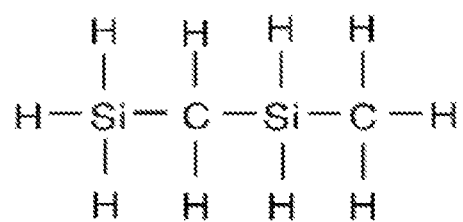
FIG. 6C is a view showing a chemical structural formula of 1,3-disilabutane.
Figure 6D:
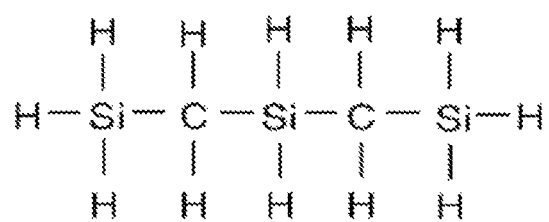
FIG. 6D is a view showing a chemical structural formula of 1,3,5-trisilapentane.
Figure 6E:
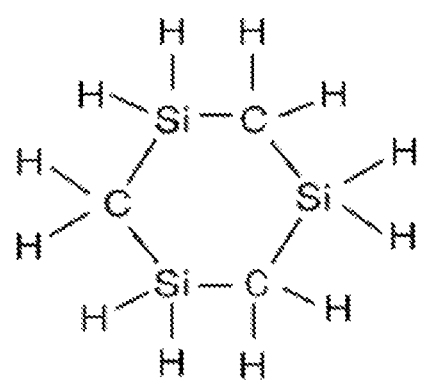
FIG. 6E is a view showing a chemical structural formula of 1,3,5-trisilacyclohexane.
Figure 6F:
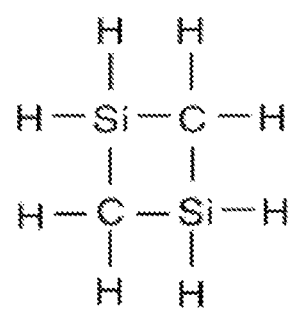
FIG. 6F is a view showing a chemical structural formula of 1,3-disilacyclobutane.

As the second precursor, in addition to the DSB gas, it may be possible to use a 1,3-disilapropane ($SiH_3CH_2SiH_3$, abbreviation: 1,3-DSP) gas, a 1,3-disilabutane ($SiH_3CH_2SiH_2CH_3$, abbreviation: 1,3-DSB) gas, 1,3,5-trisilapentane ($SiH_3CH_2SiH_2CH_2SiH_3$, abbreviation: 1,3,5-TSP) gas, a 1,3,5-trisilacyclohexane ($SiH_2CH_2SiH_2CH_2SiH_2CH_2$), abbreviation: 1,3,5-TSCH) gas, a 1,3-disilacyclobutane ($SiH_2CH_2SiH_2CH_2$, abbreviation: 1,3-DSCB) gas, or a trisilylmethane (($SiH_3)_3CH$) gas. FIG. 6A shows a chemical structural formula of 1,3-DSP, FIG. 6C shows a chemical structural formula of 1,3-DSB, FIG. 6D shows a chemical structural formula of 1,3,5-TSP, FIG. 6E shows a chemical structural formula of 1,3,5-TSCH, and FIG. 6F shows a chemical structural formula of 1,3-DSCB. These substances contain a Si—H bond and a Si—C bond and do not contain halogen at all. In addition, these substances do not contain almost or at all a C—C bond, a C—O bond, a Si—R bond, a N—H bond, and a N—O bond which may be a factor to cause a decrease in processing resistance of the SiCN film formed on the wafer 200.

The processing procedure and process conditions in step F can be the same as the processing procedure and process conditions in step D. By step F, it is possible to remove the DSB gas floating in the process chamber 201.

This modification can also obtain the same effects as the film-forming sequence shown in FIG. 4. Further, according to this modification, it is possible to make the SiCN film formed on the wafer 200 into a film having excellent processing resistance which contains Si and N in the form of a Si—N bond and Si and C in the form of a Si—C bond and does not contain a bond which may be a factor to cause a decrease in processing resistance.

(Modification 2)

As in the film-forming sequence shown below, a silicon oxynitride film (SiON) may be formed as a film so as to embedded in the recess formed on the surface of the wafer 200 by performing a cycle a predetermined number of times (n times, where n is an integer of 1 or more), the cycle further including a step G of supplying an $O_2$ gas as a reactant to the wafer 200 in the process chamber 201 and a step H of exhausting the $O_2$ gas remaining in the process chamber 201, in addition to steps A to D.

In step G, the $O_2$ gas is supplied to the wafer 200, that is, the second layer formed on the wafer 200, in the process chamber 201. Specifically, the opening/closing control of the valves 243d, 243e, and 243f is performed in the same procedure as the opening/closing control of the valves 243b, 243e, and 243f in step A. The flow rate of the $O_2$ gas is controlled by the MFC 241d, and the $O_2$ gas is supplied into the process chamber 201 via the gas supply pipe 232b and the nozzle 249b and is exhausted through the exhaust pipe 231. In this operation, the $O_2$ gas is supplied to the wafer 200. The process conditions in step G can be, for example, the same as the process conditions in step C. By supplying the $O_2$ gas to the wafer 200 under such process conditions, it is possible to oxidize (modify) at least a portion of the second layer. This makes it possible to form a silicon oxynitride layer (SiON layer), which is a layer containing Si, O, and N, as a third layer, in the recess formed on the wafer 200.

As the reactant (O-containing gas), in addition to the $O_2$ gas, it may be possible to use a nitrous oxide ($N_2O$) gas, a nitric oxide (NO) gas, a nitrogen dioxide ($NO_2$) gas, a carbon monoxide (CO) gas, a carbon dioxide (CO$_2$) gas, an ozone (O$_3$) gas, a hydrogen peroxide (H$_2$O$_2$) gas, water vapor (H$_2$O gas), an O$_2$ gas+hydrogen (H$_2$) gas, or the like.

The processing procedure and process conditions in step H can be the same as the processing procedure and process conditions in step D. By step H, it is possible to remove the O$_2$ gas floating in the process chamber 201.

This modification can also obtain the same effects as the film-forming sequence shown in FIG. 4.

(Modification 3)

After the film-forming step is performed, the temperature of the heater 207 may be appropriately adjusted, and as post-treatment, the film formed so as to be embedded in the recess on the surface of the wafer 200 may be heat-treated (annealed).

The process conditions of this step are exemplified as follows.

N$_2$ gas supply flow rate (for each gas supply pipe): 0 to 20,000 sccm

Processing temperature: 600 to 1,000 degrees C.

Processing pressure: 0.1 to 100,000 Pa

Processing time: 1 to 300 minutes

This modification can also obtain the same effects as the film-forming sequence shown in FIG. 4. Further, by performing the annealing treatment, it is possible to desorb impurities such as H contained in the film formed on the wafer 200 from the film. Further, it is possible to densify the film formed on the wafer 200, thereby further enhancing the processing resistance of this film. Further, it is also possible to avoid an increase in the dielectric constant of the film formed on the wafer 200 when the film is exposed to the atmosphere.

Other Embodiments of the Present Disclosure

The embodiments of the present disclosure have been specifically described above. However, the present disclosure is not limited to the above-described embodiments, but may be changed in various ways without departing from the gist thereof.

For example, a silicon carbide film (SiC film), a SiCN film, a silicon oxycarbide film (SiOC film), and a silicon oxycarbonnitride film (SiOCN film) may be formed so as to be embedded in the recess formed on the surface of the wafer 200 according to the film-forming sequences shown below. These cases can also obtain the same effects as the above-described embodiments and modifications described with reference to FIG. 4.

(BCl$_3$→P→DSB→P)×n⇒SiC

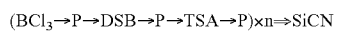
(BCl$_3$→P→DSB→P→TSA→P)×n⇒SiCN

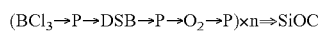
(BCl$_3$→P→DSB→P→O$_2$→P)×n⇒SiOC

(BCl$_3$→P→TSA→P→DSB→P→O$_2$→P)×n⇒SiOCN

(BCl$_3$→P→DSB→P→TSA→P→O$_2$→P)×n⇒SiOCN

Recipes used in substrate processing may be prepared individually according to the processing contents and may be stored in the memory 121c via a telecommunication line or the external memory 123. Moreover, at the beginning of substrate processing, the CPU 121a may properly select an appropriate recipe from the recipes stored in the memory 121c according to the processing contents. Thus, it is possible for a single substrate processing apparatus to form films of various kinds, composition ratios, qualities, and thicknesses with enhanced reproducibility. Further, it is possible to reduce an operator's burden and to quickly start the substrate processing while avoiding an operation error.

The recipes mentioned above are not limited to newly-prepared ones but may be prepared, for example, by modifying existing recipes that are already installed in the substrate processing apparatus. Once the recipes are modified, the modified recipes may be installed in the substrate processing apparatus via a telecommunication line or a recording medium storing the recipes. In addition, the existing recipes already installed in the existing substrate processing apparatus may be directly modified by operating the input/output device 122 of the substrate processing apparatus.

The example in which a film is formed using a batch-type substrate processing apparatus capable of processing a plurality of substrates at a time has been described in the above-described embodiments. The present disclosure is not limited to the above-described embodiments, but can be suitably applied, for example, to a case where a film is formed using a single-wafer type substrate processing apparatus capable of processing a single substrate or several substrates at a time. In addition, the example in which a film is formed using a substrate processing apparatus provided with a hot-wall-type process furnace has been described in the above-described embodiments. The present disclosure is not limited to the above-described embodiments, but can be suitably applied to a case where a film is formed using a substrate processing apparatus provided with a cold-wall-type process furnace.

Even in the case of using these substrate processing apparatuses, a film-forming process can be performed according to the same processing procedures and process conditions as those in the above-described embodiments and modifications, and the same effects as those in the above-described embodiments and modifications can be achieved.

The above-described embodiments and modifications may be used in proper combination. The processing procedures and process conditions used in this case may be the same as, for example, the processing procedures and process conditions of the above-described embodiments and modifications.

According to the present disclosure in some embodiments, it is possible to improve the characteristic of embedding a film in a recess formed on a surface of a substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:
   forming a film so as to be embedded in a recess formed on a surface of a substrate by performing a cycle a predetermined number of times, the cycle including:
   (a) supplying a pseudo-catalyst to the substrate in a process chamber;
   (b) exhausting the pseudo-catalyst remaining in the process chamber;
   (c) supplying a precursor to the substrate in the process chamber; and (d) exhausting the precursor remaining in the process chamber, wherein in (a), the pseudo-catalyst is adsorbed on the surface of the substrate under a condition that chemical adsorption of the pseudo-catalyst on the surface of the substrate is unsaturated.

2. The method of claim 1, wherein adsorption components of the pseudo-catalyst on the surface of the substrate in (a) includes at least physical adsorption components.

3. The method of claim 1, wherein adsorption components of the pseudo-catalyst on the surface of the substrate in (a) includes both physical adsorption components and chemical adsorption components.

4. The method of claim 1, wherein (a) is performed under a condition that physical adsorption components of the pseudo-catalyst is present in both an upper portion and a lower portion of the recess.

5. The method of claim 1, wherein (a) is performed under a condition that both physical adsorption components and chemical adsorption components of the pseudo-catalyst are present in both an upper portion and a lower portion of the recess.

6. The method of claim 2, wherein (b) is performed under a condition that at least a portion of the physical adsorption components of the pseudo-catalyst on the surface of the substrate remains.

7. The method of claim 4, wherein (b) is performed under a condition that at least a portion of the physical adsorption components of the pseudo-catalyst in the lower portion of the recess remains while at least a portion of the physical adsorption components of the pseudo-catalyst in the upper portion of the recess is desorbed.

8. The method of claim 4, wherein (b) is performed under a condition that an amount of desorption of the physical adsorption components of the pseudo-catalyst in the upper portion of the recess is larger than an amount of desorption of the physical adsorption components of the pseudo-catalyst in the lower portion of the recess.

9. The method of claim 4, wherein (b) is performed under a condition that a residual amount of the physical adsorption components of the pseudo-catalyst in the lower portion of the recess is larger than a residual amount of the physical adsorption components of the pseudo-catalyst in the upper portion of the recess.

10. The method of claim 1, wherein in (a), the pseudo-catalyst is supplied under a condition that an adsorption reaction of the pseudo-catalyst with the surface of the substrate is reaction rate controlling.

11. The method of claim 1, wherein in (a), the pseudo-catalyst is supplied under a condition that film formation does not proceed if the pseudo-catalyst is present alone.

12. The method of claim 1, wherein in (c), the precursor is supplied under a condition that film formation does not proceed if the precursor is present alone.

13. The method of claim 1, wherein the pseudo-catalyst contains boron and halogen.

14. The method of claim 1, wherein the pseudo-catalyst contains at least one selected from the group of $BCl_3$, $BF_3$, $BBr_3$, and $BI_3$.

15. The method of claim 13, wherein the precursor contains a Si—H bond.

16. The method of claim 15, wherein the precursor further contains at least one selected from the group of a Si—N bond and a Si—C bond.

17. The method of claim 1, further comprising:
(e) supplying a second precursor to the substrate in the process chamber; and
(f) exhausting the second precursor remaining in the process chamber.

18. The method of claim 1, further comprising:
(g) supplying a reactant to the substrate in the process chamber; and
(h) exhausting the reactant remaining in the process chamber.

19. A substrate processing method, comprising:
forming a film so as to be embedded in a recess formed on a surface of a substrate by performing a cycle a predetermined number of times, the cycle including:
(a) supplying a pseudo-catalyst to the substrate in a process chamber;
(b) exhausting the pseudo-catalyst remaining in the process chamber;
(c) supplying a precursor to the substrate in the process chamber; and
(d) exhausting the precursor remaining in the process chamber,
wherein in (a), the pseudo-catalyst is adsorbed on the surface of the substrate under a condition that chemical adsorption of the pseudo-catalyst on the surface of the substrate is unsaturated.

20. A substrate processing apparatus comprising:
a process chamber in which a substrate is processed;
a pseudo-catalyst supply system configured to supply a pseudo-catalyst to the substrate in the process chamber;
a precursor supply system configured to supply a precursor to the substrate in the process chamber;
an exhaust system configured to exhaust a substance remaining in the process chamber;
a heater configured to heat the substrate in the process chamber; and
a controller configured to be capable of controlling the pseudo-catalyst supply system, the precursor supply system, the exhaust system, and the heater so as to perform the method of claim 19.

21. A non-transitory computer-readable recording medium storing a program that causes, by a computer, a substrate processing apparatus to perform a process comprising:
forming a film so as to be embedded in a recess formed on a surface of a substrate by performing a cycle a predetermined number of times, the cycle including:
(a) supplying a pseudo-catalyst to the substrate in a process chamber of the substrate processing apparatus;
(b) exhausting the pseudo-catalyst remaining in the process chamber;
(c) supplying a precursor to the substrate in the process chamber; and
(d) exhausting the precursor remaining in the process chamber,
wherein in (a), the pseudo-catalyst is adsorbed on the surface of the substrate under a condition that chemical adsorption of the pseudo-catalyst on the surface of the substrate is unsaturated.

* * * * *